United States Patent [19]

Reuter

[11] Patent Number: 5,044,970

[45] Date of Patent: Sep. 3, 1991

[54] ROTATABLE HIGH-CURRENT CONNECTOR

[75] Inventor: Wolfgang Reuter, Niddatal, Fed. Rep. of Germany

[73] Assignee: Leybold Aktiengesellschaft, Hanau, Fed. Rep. of Germany

[21] Appl. No.: 451,453

[22] Filed: Dec. 14, 1989

[30] Foreign Application Priority Data

Oct. 25, 1989 [DE] Fed. Rep. of Germany ....... 3935440

[51] Int. Cl.[5] ...................... H01R 13/533; H05K 7/20

[52] U.S. Cl. ................................... 439/196; 361/379; 361/385

[58] Field of Search ................. 439/22, 191, 271, 194, 439/274, 196; 174/15.1, 15.6; 200/289; 361/331, 332, 335, 338, 379, 385, 391, 428, 381, 429, 386-389, 382; 165/104, 33; 363/141, 146

[56] References Cited

U.S. PATENT DOCUMENTS

| | | | |
|---|---|---|---|
| 3,133,145 | 5/1964 | Bahn | 174/15.6 |
| 3,652,797 | 3/1972 | Goodman | 174/15.6 |
| 3,946,141 | 3/1976 | Schmidt | 174/15.6 |
| 4,246,626 | 1/1981 | Legrand et al. . | |
| 4,492,423 | 1/1985 | Reuter . | |

FOREIGN PATENT DOCUMENTS

| | | |
|---|---|---|
| 1439972 | 2/1969 | Fed. Rep. of Germany . |
| 2318690 | 10/1974 | Fed. Rep. of Germany . |
| 2643141 | 3/1977 | Fed. Rep. of Germany . |
| 3219721 | 12/1983 | Fed. Rep. of Germany . |
| 3418504 | 11/1984 | Fed. Rep. of Germany . |

*Primary Examiner*—Gerald P. Tolin

*Attorney, Agent, or Firm*—Felfe & Lynch

[57] ABSTRACT

The invention relates to a rotatable high-current connector 1A, 1B for establishing an electric power supply to movable consumers in closed chambers. The high-current connector includes several rotatable, coaxial pipes 2, 3, 55, 46 for the conduit of a current and a cooling agent. The pipes concerned 2, 3, 55, 46 are at one end provided with flanges 9, 13, 14, 11. Two stationary counter flanges 19, 20 which are insulated with respect to one another are disposed coaxially to these two flanges 9, 13. The electric connection is established via two bundles of strands 17, 18.

In order to provide a passage of two separate circulatory cooling systems across the high-current connector 1A, 1B, the internal borehole 4 and the annular hollow space 5 can be connected to the first circulatory cooling system, on the one side, via screwed fittings *7a, 7b* and, on the other side, via flanges 41, 43 having boreholes 34, 40 and they can be connected to the second circulatory cooling system and the two annular gaps 50, 51 via two connecting pieces 8*a,* 8*b,* on the one side, and, on the other side, via the connecting flange 33 having boreholes 36, 37.

7 Claims, 2 Drawing Sheets

ROTATABLE HIGH-CURRENT CONNECTOR

Figure 1:
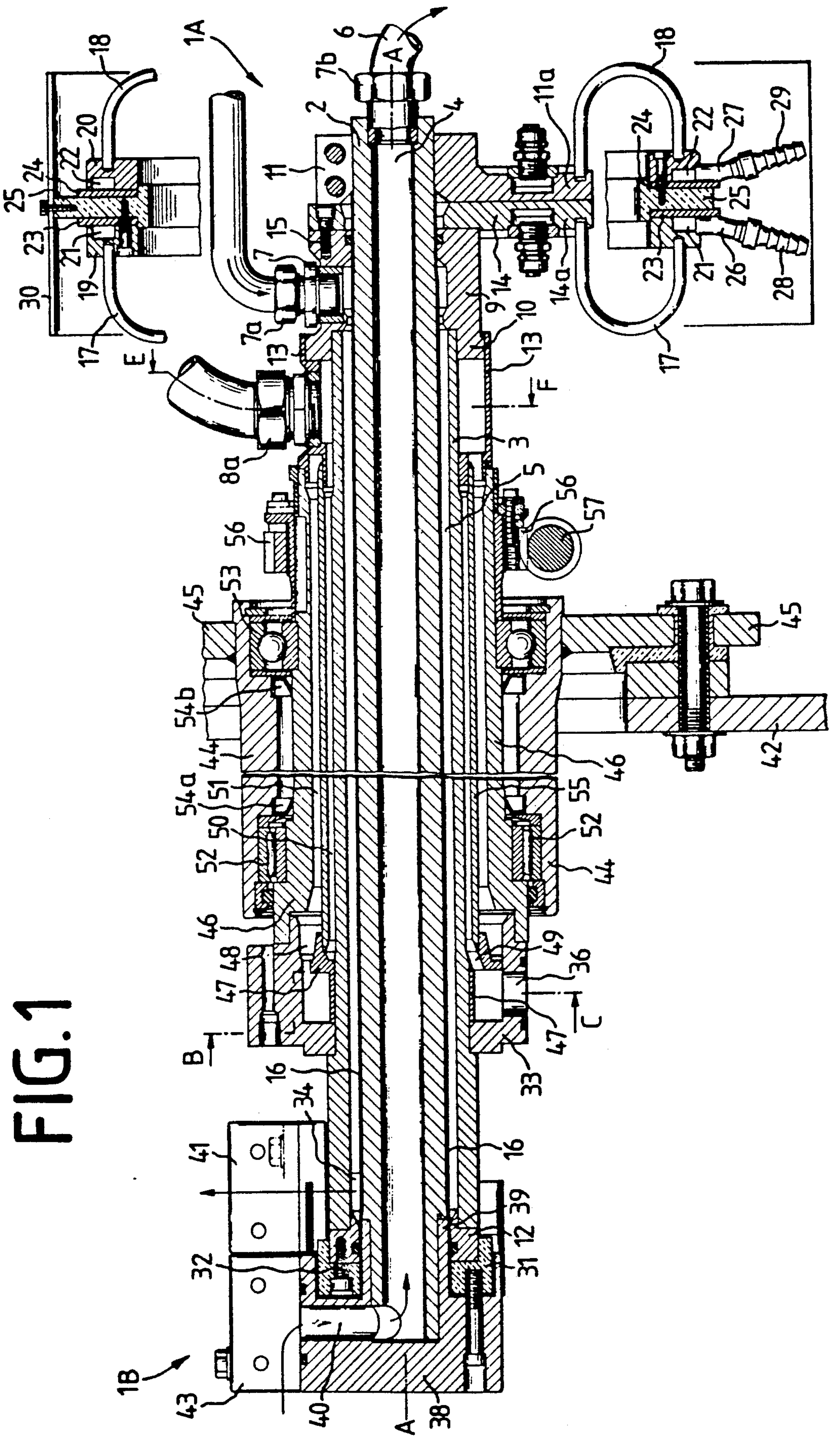

The invention relates to a rotatable high-current connector for establishing an electric power supply to movable elements in closed chambers, including a coaxial arrangement of an electrically conductive internal pipe with external pipes the hollow spaces of which serve as a conduit for cooling agents. At their ends which are connected to a stationary power supply, these pipes are provided with a metallic flange, respectively, from which a bundle of metallic strands leads to a respectively corresponding metallic counter flange and the counter flanges of this stationary power supply are provided with cooling devices.

High-current connectors of the aforesaid kind are necessary, for example, for supplying high operating currents into closed chambers when limited rotating and pivoting movements must be carried out between the elements inside and outside of the bounding walls of these chambers. This is required, for example, for electrically-operated systems like melting and casting systems where the material to be melted is cast by tipping the crucible while this crucible and the heating device form one single unit.

In this connection, it is of particular significance that the high-current connector simultaneously serves the purpose of supplying and withdrawing a cooling agent which protects parts of the furnace, for example an inductor coil, from overheating.

Devices involving pressure differences on both sides of the bounding walls of the closed chambers, for example vacuum furnaces, also include special demands regarding the density of the high-current connectors. High-current connectors of the aforesaid kind, however, are not restricted to the use in melting and casting furnaces.

A significant weak point of such high-current connectors are the flexible parts which are configured as strands and made of thin copper wire.

Because of obvious prior use, a high-current connector of the aforesaid kind has been known for many years. This connector includes four metallic annular flanges which are concentrically disposed in one another in pairs. They are joined to one another by means of U-shaped strands such that one internal and one external annular flange, respectively, are connected to the same voltage. The back-to-back annular flanges of a different polarity are electrically separated by means of insulating rings. From a mechanical point of view, however, they form one single unit in which the internal annular flanges can perform a pivoting movement which is limited with respect to the external annular flanges. Clamping screws are used to attached the strands at their ends in the flanges. The bundles of strands of the one potential are approximately mirror-symmetrical with respect to the bundles of strands of the other potential and the symmetrical plane is located approximately inside the insulating rings between the flanges. An appropriate loop length of the strands ensures that the pivoting angle is wide enough. The internal, rotatable annular flanges have different diameters and rest on the external surfaces of the coaxial pipes which transmit the current and the cooling agent across the bounding wall of the closed chamber to the movable parts contained in this chamber.

Whereas it was possible to sufficiently dimension the rigid coaxial pipes and sufficiently cool these pipes by using the cooling water for the crucible heating, the strands were constantly exposed to the risk of overheating. The reason for this was the contact resistance at the clamping points, on the one hand, and the ohmic resistance of the strands, on the other hand, which could not be selected so as to be sufficiently small. Further, space did not permit a larger average diameter of the entire strand system. Neither could the overheating of the strands be avoided by soldering a cooling element onto the external surface of the external flanges. The known accomplishment is hence suited for a certain dimension for only a relatively small total current thus strictly limiting the possibilities of use of the known high-current connector.

Hence, a more efficient way of cooling the strands was required. This object was achieved in that the strands of one polarity were placed into the hollow space of the internal pipe and the strands of the other polarity were placed into the annular chamber between the internal and coaxial external pipe. The pipes themselves are made of an insulating material. An arrangement of this kind is known from German patent DE 23 18 690 and has proven itself in the practice by a high current-carrying capacity.

In practice, however, it turned out that the surrounding cooling water caused a high corrosion rate of the strands in connection with furring such that the corresponding high-current connectors had to be replaced from time to time. As long as the cooling water met certain purity requirements, the known high-current connectors had a long enough service life. However, since occasional water contaminations also occurred, it appeared desirable to remove the strands again from the water. This however would have lead to a drastic reduction of the specific capacity of the strands. It was hence suggested (German Patent 32 19 721) providing the flange which is co-rationally connected to the internal pipe with a channel for a cooling agent.

It is hence an object of the invention to provide a rotatable high-current connector of the aforesaid kind which—given the same dimensions—essentially exhibits the same capacity as the above described high-current connector and, in addition, is suited to have an opening for a second circulatory cooling system required for cooling the crucible.

The object is accomplished with a high-current connector of the aforesaid kind in accordance with the invention by combining the following features:

a. The flange which is co-rationally connected with a first external pipe approaches the interspace between external pipe and internal pipe such that the first hollow space can be brought in direct contact with the cooling agent, b. the two counter flanges which belong to the stationary power supply line are also provided with cooling channels disposed in their interior, c. the strands are at both ends incorporated in the appertaining flanges by means of metallic soldering connections.

A preferred embodiment has at least four pipe-like components which are coaxially associated with one another. Together they form four channels for a pressure medium. Those two channels which radially at the exterior are connected to one another via two flanges the first of which is disposed at the one end of the two pipe-like components and the second one is at the other ends of the two pipe-like components. These two flanges have two radially extending connecting boreholes or connecting pieces, respectively, and surround another pipe of a greater total length the ends of which are supported by two additional flanges.

The claims characterize and explain additional details and features of the invention in further detail.

The invention permits the most various embodiments.

The FIGS. 1 to 4 explain an embodiment of the invention in further detail. Referring now to the Figs.

Figure 2:
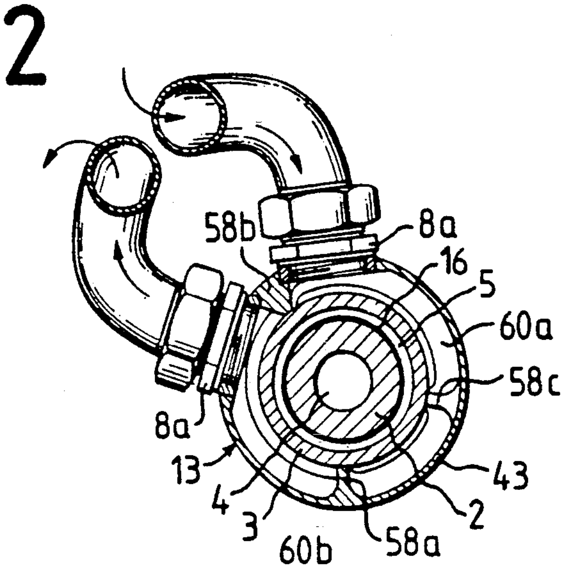
Figure 3:
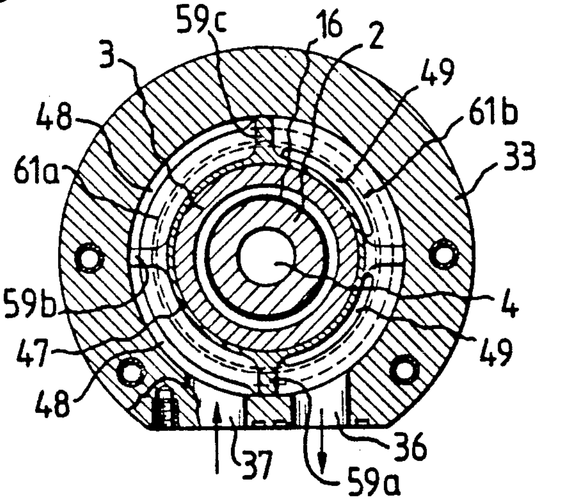
Figure 4:
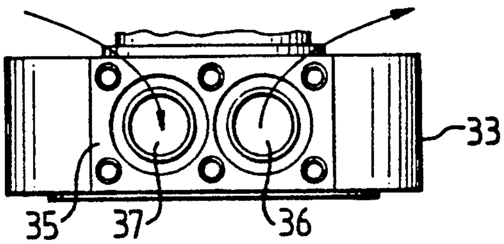

FIG. 1 is an axial section of a high-current connector where the stationary annular flanges are connected via strands with the rotatable annular flanges (right portion of Fig.) and via the completely rotatable end of the high-current connection, they are connected with the connecting elements for the pivotable consumer (left portion of Fig.), FIG. 2 is a section across the high-current connector of FIG. 1 taken along lines E-F, FIG. 3 is a section across the high-current connector of FIG. 1 taken along lines B-C and FIG. 4 is a top view of the connecting flange of FIG. 3.

In FIG. 1 the two ends of the rotatable high-current connector bear the reference numerals 1A and 1B. Between theses two ends there is the one wall 42 which bounds the closed chamber which contains the end 1B. The wall in question is only partially represented.

The high-current connector has an electrically conductive internal pipe 2 and a like external pipe 3 which, however, is smaller in length and is disposed concentrically with respect to the internal pipe 2. In the internal pipe 2 there is a hollow space 4 for guiding the cooling agent. An annular hollow space 5 which also serves to guide the cooling agent is formed between the internal pipe 2 and the external pipe 3. A pipe bend 6 with a screwed fitting 7*b* joins the internal hollow space 4 to a not represented flexible cooling agent line. A lateral connecting piece 7 connects the external hollow space 5 with a flexible cooling water line.

The front side of the external pipe 3 which can be seen in FIG. 2 is rigidly connected with a metallic flange 9 with a screwed fitting 7*a*; via an extension 10 this flange 9 extends into a flange 13 with the connecting pieces 8*a*, 8*b* and during operation the front side is thus in direct contact with the cooling agent contained in the hollow space 5. For a good centering, the flange 9 is provided with three radial grooves which are not referenced. These grooves bear non-represented seals for sealing purposes with respect to the external pipe 3, the internal pipe and the flange 13. There is no rotating movement between the internal pipe 2 and the external pipe 3 since the two pipes 2, 3 form together the flange 13 as one rigid system which can be moved as a whole.

A flange 11 is co-rationally disposed on the internal pipe 2 opposite the front side of the external pipe 3.

Between the two flanges 9 and 11, there is an additional flange 14 which is electrically insulated with respect to the flange 11 and has screws 15 connecting the flange 9 to the flange 14. An insulating cover 16 extends over a certain length of the internal pipe 2. This cover extends into the flange 14 such that the prescribed potential difference between the flange 9 and the internal pipe 2 can be maintained. The flanges 9 and 11 as well as the flange 14 are relatively rigid to one another and form a structural component which is rigid in itself and is able to carry out pivoting movements only in connection with the pipe system.

The sides 11*a* and 14*a* of the flanges 11 and 14 which radially extend toward the exterior contain an equidistantly distributed multiple of axially aligned boreholes into which the U-shaped strands 17 and 18 are soldered. The strands of each polarity form a bundle whereby the central lines of the strands are in the center of the pivoting area in radial planes to the symmetric axis A—A.

The far ends of the strands 17 and 18 are soldered into the counter flanges 19 and 20 which, for this purpose, are provided with the same number of axially aligned boreholes as are the flanges 11 and 14. Each of the two counter flanges 19 and 20 has a circumferential channel 21 and 22 for the cooling agent which in turn is sealed by means of a closing ring 23 and 24, respectively. Between the counter flanges 19 and 20, there is a spacing ring 25 which is made of insulating material and to which the counter flanges 19 and 20 are welded so as to form a rigid component.

The power supply lines 26 and 27 lead to the counter flanges 19 and 20; they are at the same time configured as lines for the cooling agent and are provided with connecting pieces 28 and 29 for tubes.

With respect to the system axis A—A, the entire arrangement is for the most part dynamically balanced except the connection for power and cooling water leading toward the bottom. The live parts of different polarities are surrounded by a covering hood 30 so as to be protected against contact.

At the left end of the high-current connector the external hollow space 5 is closed by an insulating body 31 which is provided with two pairs of non-referenced radial grooves containing the sealing rings. Tensioning screws 32 serve to brace the insulating body 31 with respect to the external pipe 3. From the latter a radial connecting flange 33 leads to a connecting flange 35; it serves not only to transmit power but also to further channel the cooling agent and for this purpose the flange is provided with connecting boreholes 36 and 37.

A further connecting flange 38 is screwed to the insulating body 31 which is dynamically balanced. Via a cylindrical extension 39, this flange is electrically connected to the internal pipe 2. The connecting flange 38 also serves to transmit the operating current as well as the cooling agent. For this purpose the extension 39 is provided with a radial borehole 40 which is aligned with the internal hollow chamber 4. An additional connecting flange 41 is attached to the side of the external pipe 3 and via the radially extending borehole 34 it is connected to the hollow space 5 for the cooling water inlet flow.

When attaching the movable consumer, for example an induction melting device which is to be supplied with a medium frequency, the flanges 41 and 43 and the boreholes 40, 34 thereof are connected to the consumer. The consumer thus functions as a continuation of the high-current connector, i.e. the consumer not only serves to close the power circuit but also the circulatory system for the cooling agent. The flanges 41 and 43 can also be connected to the connection flanges of an hollow induction coil containing a crucible. Conventionally, this crucible has a pouring lip for pouring out the contents of the crucible into a mold when tilting the crucible. The pivoting movement required for this purpose is generated by the above described high-current connector. The right end of the high-current connector as represented in FIG. 1 is protected by an insulating cover 30.

In case the crucible itself must be cooled, the two connecting boreholes 36, 37 are connected thereto and the left connecting pieces 8*a*, 8*b* which correspond to these boreholes are connected to the inlet and the return flow of the cooling water system, respectively.

In order to be able to rotate the described high-current connector with respect to wall 42 of a non-represented vacuum chamber, the bearing bush 44 with its flange 45 is pressure-tight screwed to the wall. The bearing bush 44 in turn surrounds the bearing pipe 46 which is firmly and pressure-tight connected to the flange 13 and the ring 47. This ring is pressed into the connecting flange 33 and provided with openings 48, 49 which correspond with the annular gaps 50 and 51 formed by the pipes 3, 55 and 46. Roller bearings and ball bearings 52 and 53 and a sealing package 54*a*, 54*b* are disposed between the bearing pipe 46 and the bearing bush 44.

As it can be seen in FIGS. 2 and 3, the flanges 13 and 33, 47, respectively, are provided with three or four radially extending connecting ribs or arms 58*a*, 58*b*, 58*c* and 59*a*, 59*b* , 59*c*, 59*d*. Two of these arms 58*a*, 58*b* and 59*a*, 59*b*, respectively, divide the annular chamber formed by the two pipe-like components 5 and 46 in chambers 60*a*, 60*b* and 61*a*, 61*b* with a sickle-like cross section. One of these chambers, respectively, is connected to the annular chamber 51 and the other one, respectively, is connected to the annular chamber 50 and also joined to one of the connections 8*a*, 8*b* and 36, 37, respectively, for the pressure medium. It is particular to the flange 33 that it consists of two pieces with the four radial connecting arms 59*a*, 59*b*, 59*c*, 59*d* being part of the internal ring 47 and forming the openings 48, 49 for the passage of the pressure medium.

I claim:

1. Rotatable high-current connection for establishing an electric power supply to movable elements in closed chambers, comprising:

an electrically conductive internal pipe and coaxially therewith external pipes the pipes having hollow spaces or channels therein which serve to channel a cooling agent and having metallic flanges at their ends;

stationary power supply lines and a bundle of metallic strands leading therefrom;

corresponding, metallic counter flanges connected to the metallic strands at the stationary power supply lines;

the counter flanges at the stationary power supply lines having cooling devices;

at least four of said pipes being disposed so as to be coaxial to one another and together forming four of said channels for a pressure medium;

two flanges of which a first one is disposed at one end of two of said pipes and a second one is disposed at another end of the two pipes, for connecting two said channels which are radially at the exterior;

these two flanges having two radially extending connecting boreholes and connecting pieces, pieces and surrounding another pipe of a greater total length; and two further flanges for supporting ends of said pipe of a greater total length.

2. Rotatable high-current connector in accordance with claim 1, wherein said two flanges are axially disposed between the ends of said pipe 2 and which have radially extending ribs dividing said four channels for the pressure medium in the area of the flanges into sections for the pressure medium, said sections having their own radial channels for the pressure medium channels being connected to said boreholes and said connecting pieces.

3. Rotatable high-current connector for establishing an electric power supply to movable elements in closed chambers, comprising:

an electrically conductive internal pipe and coaxially therewith three external pipes the four pipes having hollow spaces therein which serve to guide cooling agents and have metallic flanges at their ends;

stationary power supply lines connected with the metallic flanges;

a bundle of metallic strands connected to the flanges;

corresponding, metallic counter flanges, connected to the metallic strands respectively, at the stationary power supply lines;

the counter flanges at the stationary power supply lines having cooling devices; 22;

a flange which is co-rationally connected to a first external pipe approaching a hollow space between the external pipe and an internal pipe such that a first hollow space can be brought in direct contact with a cooling agent;

the two counter flanges at the stationary power supply being provided with channels for a cooling agent disposed in their interiors, and 12 a metallic soldering connection being used to incorporate the strands at their two ends in appertaining flanges.

4. Rotatable high-current connector in accordance with claim 3, which includes flanges of the internal pipe and the external pipes which are guided so as to be freely rotatable.

5. Rotatable high-current connector in accordance with claim 3, in which the pipe which is radially at the inside has an insulating cover on its external surface area, whereby only two free ends of this pipe are electrically connected to first and last flanges, and form a conductor for an inside power potential, whereas all of said pipes which are provided coaxially to this internal pipe form an external power potential.

6. Rotatable high-current connector in accordance with claim 3, which includes a bearing bush surrounding one of said pipes which is radially at the outside, the bearing bush being connected to ac chamber wall and two roller and ball bearings for supporting and guiding the bearing bush, a sealing arrangement being disposed between the two bearings.

7. Rotatable high-current connector in accordance with claim 3, which includes a toothed ring and a worm drive connected thereto, and together with all four of said pipes the toothed ring can be rotated around the longitudinal axis A—A of the high-current connector.

* * * * *

UNITED STATES PATENT AND TRADEMARK OFFICE
CERTIFICATE OF CORRECTION

PATENT NO. : 5,044,970

DATED : September 3, 1991

INVENTOR(S) : Wolfgang Reuter

It is certified that error appears in the above-identified patent and that said Letters Patent is hereby corrected as shown below:

Column 6, line 25 delete "22;"

Column 6, line 33 delete "12"

Column 6, line 32, before "being", insert --lines--

Signed and Sealed this

First Day of November, 1994

Attest:

Bruce Lehman

BRUCE LEHMAN

*Attesting Officer*

*Commissioner of Patents and Trademarks*